(12) United States Patent
Mazingue-Desailly et al.

(10) Patent No.: US 9,462,696 B2
(45) Date of Patent: Oct. 4, 2016

(54) CIRCUIT MODULE AND METHOD FOR PRODUCING SUCH A CIRCUIT MODULE

(75) Inventors: Stephan Mazingue-Desailly, Ludwigsburg (DE); Michael Mueller, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 153 days.

(21) Appl. No.: 13/514,549

(22) PCT Filed: Dec. 7, 2010

(86) PCT No.: PCT/EP2010/069072
§ 371 (c)(1),
(2), (4) Date: Sep. 13, 2012

(87) PCT Pub. No.: WO2011/070015
PCT Pub. Date: Jun. 16, 2011

(65) Prior Publication Data
US 2013/0208433 A1    Aug. 15, 2013

(30) Foreign Application Priority Data
Dec. 8, 2009   (DE) .................. 10 2009 047 681

(51) Int. Cl.
*H05K 1/18* (2006.01)
*H05K 3/30* (2006.01)
(Continued)

(52) U.S. Cl.
CPC .......... *H05K 1/185* (2013.01); *B60R 16/0239* (2013.01); *H05K 3/28* (2013.01); *H05K 3/284* (2013.01); *H05K 3/30* (2013.01); *H05K 5/065* (2013.01); *H05K 5/069* (2013.01);
(Continued)

(58) Field of Classification Search
CPC ............ H05K 1/18; H05K 3/30; H05K 3/28; H05K 1/185
USPC ........ 361/760, 728, 800, 816, 818; 174/350, 174/358, 370, 255, 260
See application file for complete search history.

(56) References Cited

U.S. PATENT DOCUMENTS 4,814,943 A * 3/1989 Okuaki .................. 361/783
5,001,548 A * 3/1991 Iversen .................. 257/714
(Continued)

FOREIGN PATENT DOCUMENTS

CN    1468503    1/2004
CN    201233037  5/2009
(Continued)

OTHER PUBLICATIONS

PCT/EP2010/069072 International Search Report dated Aug. 9, 2011 (Translation and Original, 4 pages).

*Primary Examiner* — Eric Thomas
*Assistant Examiner* — Michael P McFadden
(74) *Attorney, Agent, or Firm* — Michael Best & Friedrich LLP

(57) ABSTRACT

The invention relates to a circuit module (10) having a circuit carrier (12), at least one circuit (14) mounted on the circuit carrier (12), encapsulated by a protective material (16), and at least one electrical/electronic component (18) encapsulated by a protective coating (20), protecting the at least one electrical/electronic component (18) from the protective material (16), and to a method for producing the circuit module (10). According to the invention, the protective coating (20) protecting the at least one electrical/electronic component (18) is only partially encapsulated by the protective material (16).

17 Claims, 4 Drawing Sheets

(51) Int. Cl.
*H05K 3/28* (2006.01)
*B60R 16/023* (2006.01)
*H05K 5/06* (2006.01)

(52) U.S. Cl.
CPC ............. *H05K2203/1178* (2013.01); *H05K 2203/1316* (2013.01); *Y10T 29/49146* (2015.01)

(56) References Cited

U.S. PATENT DOCUMENTS 5,392,197 A * 2/1995 Cuntz et al. .................. 361/818
5,473,512 A * 12/1995 Degani .................. H01L 23/04
  174/256
6,366,462 B1 * 4/2002 Chu et al. ..................... 361/699
8,156,644 B2 4/2012 Babb et al.
2007/0071886 A1 * 3/2007 Babb ..................... H01L 23/552
  427/96.3

FOREIGN PATENT DOCUMENTS

| | | |
|---|---|---|
| DE | 19626083 | 1/1998 |
| DE | 10252755 | 5/2004 |
| JP | 62121514 | 6/1987 |
| JP | 2001102714 | 4/2001 |
| JP | 2001293752 | 10/2001 |
| JP | 2002335094 | 11/2002 |
| JP | 2008164401 | 7/2008 |

* cited by examiner

CIRCUIT MODULE AND METHOD FOR PRODUCING SUCH A CIRCUIT MODULE

BACKGROUND OF THE INVENTION

The invention is based on a circuit module and on a method for producing such a circuit module.

Controllers are known generally for controlling a wide variety of functions and devices and are increasingly being used in the automotive sector for the purpose of controlling a wide variety of functions of a motor vehicle. The rapidly rising number of electrical and electronic applications in modern motor vehicles is resulting in a significantly rising number of controllers. This increasingly requires the use of smaller and lighter and also less expensive controllers. Such controllers could therefore also be used in mid-range vehicles or in small cars or for motorized bicycles in future.

To date, controllers have had a circuit module which comprises a circuit carrier, for example a printed circuit board or a ceramic substrate, electrical/electronic components and a package. The ever further rising demands with regard to robustness, such as corrosion resistance and temperature resistance, require new embodiments of the circuit modules. Thus, the package of the circuit module is increasingly in the form of a protective mass which surrounds the circuit carrier and the components. When the protective mass is produced, the circuit carrier and the components are usually encapsulated with a hard encapsulation material or surrounded with a thermosetting plastic by injection molding, for example by thermal transfer molding.

By way of example, laid-open specification DE 102 52 755 A1 describes a circuit module which comprises a circuit carrier, a circuit mounted on a circuit carrier and a discrete component, wherein the circuit is surrounded by a protective mass. In order to protect the discrete component from the strain during production of the protective mass, said discrete component has a protective shell which surrounds the discrete component. The protective mass covers both the circuit and the discrete component surrounded by the protective shell.

In this embodiment, however, it is not possible to use certain components, such as electrolytic capacitors or pressure sensors, on the circuit carrier, since these components cannot be embedded completely into the protective mass. By way of example, electrolytic capacitors do not withstand the pressure produced during encapsulation or injection molding in mechanical terms. It is also impossible to encapsulate electrolytic capacitors completely, since an electrolytic capacitor "breathes" during operation, i.e. the diameter of the electrolytic capacitor alters slightly during operation. By way of example, pressure sensors record the ambient air pressure which is usually required in controllers in vehicle engines for matching the injection molding parameters to the respective ambient air pressure.

SUMMARY OF THE INVENTION

The circuit module according to the invention has, by contrast, the advantage that a protective shell protecting at least one electrical/electronic component is surrounded by the protective mass only in part.

The method according to the invention for producing a circuit module has, by contrast, the advantage that at least one circuit and at least one electrical/electronic component is mounted on a circuit carrier, a protective shell arranged around the at least one electrical/electronic component is put onto the circuit carrier, the protective shell is pressed onto the circuit carrier using a suitable tool, and a protective mass is cast which surrounds the at least one circuit completely and the protective shell of the at least one electrical/electronic component in part.

Embodiments of the present invention allow thermal and mechanical protection of electrical/electronic components which, on account of their mechanical properties or their functions which can be performed, cannot be directly subjected to injection molding or encapsulated and are nevertheless used for injection molded or encapsulated circuit modules. Surrounding the protective shell in part with protective mass produces component protection which protects the sensitive electrical/electronic components from the injection molding or encapsulation or from the casting compound, as a result of which the electrical/electronic components are able to perform their function completely. In these embodiments, it is possible to use certain components, such as electrolytic capacitors or pressure sensors, on the circuit carrier, since these components are not embedded into the protective mass but rather are surrounded by a protective shell. By way of example, electrolytic capacitors do not withstand the pressure produced during encapsulation or injection molding in mechanical terms. As a result of the protective shell being provided for the purpose of protecting the electrolytic capacitor from the protective mass, and said protective shell being surrounded by protective mass only in part, it is also possible to use electrolytic capacitors. Since an electrolytic capacitor "breathes" during operation, i.e. alters its diameter slightly during operation, the protective shell according to the invention also allows the function of the electrolytic capacitor to be performed after the protective mass has been cast. By way of example, pressure sensors record the ambient air pressure which is usually required in controllers in vehicle engines for matching the injection molding parameters to the respective ambient air pressure. As a result of the protective shell which holds the pressure sensor being surrounded by protective mass only in part, the pressure sensor can record the ambient air pressure even after the protective mass has been cast.

Of particular advantage is that the protective shell forms a holding area for holding the at least one component and a flange area for tethering the protective shell to the circuit carrier. In one embodiment of the protective shell, the holding area of the protective shell is in the form of a pot, the open end of which accommodates the flange area, which is in the form of a circumferential collar. Expediently, the simple geometric structure of the parts to be joined advantageously allows simple and inexpensive mounting of the protective shell on the circuit carrier. The protective shell, which is in pot form or in beaker form, with the flange area in the form of a circumferential collar, advantageously has a high level of robustness. As a result, the protective shell has a high level of dimensional stability during mounting, particularly during the pressing-on process, in which a pressing force is applied to the protective shell, and provides a large surface area as a secure undercut for tethering to the circuit carrier during injection molding or encapsulation with protective mass. In addition, the flange area in the form of a circumferential collar is advantageously used to distribute the pressing force acting on the protective shell over a large surface area. Furthermore, the geometric stability of the protective shell provides optimum protection for the at least one electrical/electronic component during the mounting process and during the subsequent operation of the finished circuit module.

In one embodiment of the invention, the flange area has at least one sealing device. Advantageously, the at least one sealing device fitted to the protective shell is elastically deformed during the casting of the protective mass and thereby performs a sealing function. In a further embodiment of the invention, the flange area has at least one structure into which protective mass is advantageously introduced during the casting of the protective mass, as a result of which better tethering of the protective shell to the protective mass and to the circuit carrier is ensured.

In a further embodiment of the circuit module according to the invention, the protective shell has a pressure equalization device, as a result of which the ambient air pressure can advantageously also prevail in the interior of the protective shell. This advantageously allows a pressure sensor to be provided as an electrical/electronic part, said pressure sensor recording the ambient air pressure in order to perform its intended function. Such pressure sensors are usually used in controllers in vehicle engines for matching the injection molding parameters to the respective ambient air pressure.

In a further embodiment of the circuit module according to the invention, the protective shell and/or the protective mass are produced using an injection molding method. Advantageously, this results in simple and inexpensive production of the circuit module. In particular, it allows any desired shape to be produced, so that, by way of example, the protective shell can be designed such that it is also possible for a plurality of electrical/electronic components arranged on the circuit carrier to be protected.

In a further embodiment of the circuit module according to the invention, the protective shell is produced from a plastic, particularly from a thermoplastic. This advantageously renders the protective shell able to protect the at least one electrical/electronic component from the thermal and mechanical strains which occur when casting the protective mass or when injection molding protective mass around the circuit module.

An exemplary embodiment of the invention is shown in the drawings and is explained in more detail in the description below.

DETAILED DESCRIPTION

Figure 1:
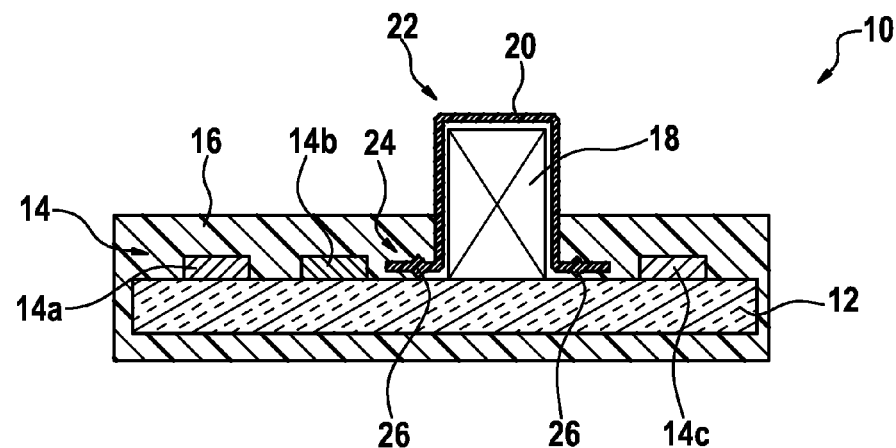
FIG. 1 shows a schematic sectional illustration of an exemplary embodiment of a circuit module according to the invention with a circuit carrier on which a circuit surrounded by a protective mass and a component surrounded by a protective shell are mounted.
Figure 2:
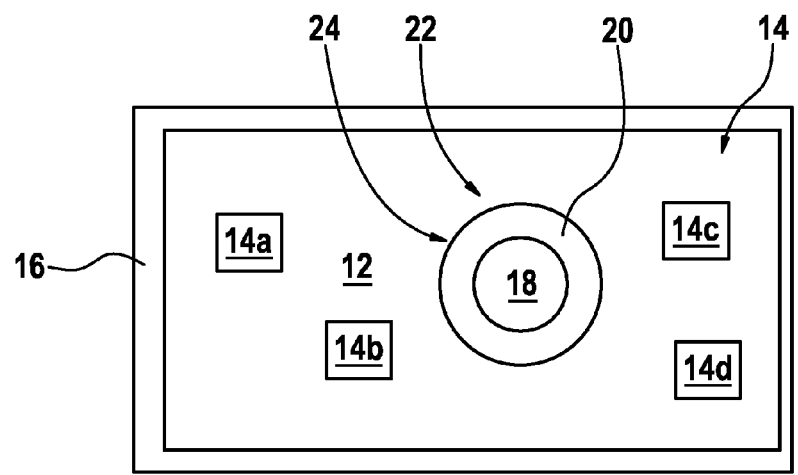
FIG. 2 shows a plan view of the circuit module from FIG. 1.

FIG. 1 and FIG. 2 show an inventive embodiment of a circuit module 10 having a circuit carrier 12, a circuit 14 which is mounted on the circuit carrier 12 and which is surrounded by a protective mass 16, and an electrical/electronic component 18 which is surrounded by a protective shell 20. Self-evidently, further circuits 14 and/or electrical/electronic components 18 may also be provided on the circuit carrier 12. Preferably, the circuit carrier 12 comprises a printed circuit board and/or a substrate which is preferably in the form of a plastic substrate or in the form of a ceramic substrate.

In the present exemplary embodiment, the circuit 14 comprises a plurality of electrical/electronic components 14a to 14d which are completely surrounded by the protective mass 16. Therefore, the protective mass 16 forms the package of the electronic/electrical components 14a to 14d and protects them from electrical and mechanical loads. The electronic/electrical components 14a to 14d suitable for injection molding or encapsulation may be in the form of integrated circuits (ICs), transformers, inductor coils, relays, connectors or similar discrete components, for example. The discrete components may comprise all kinds of active or passive components, such as resistors, capacitors, inductances, semiconductor components such as diodes, transistors or the like. Equally, combinations of such components, such as series or parallel circuits, may be provided as the circuit 14. By way of example, the circuits 14 or discrete components 14a to 14d may be in the form of packaged or encapsulated or injection molded wire components or SMD components (surface mounted device components) which are mounted on a separate circuit board. In the present exemplary embodiment, the electrical/electronic component 18 which is not suitable for injection molding or encapsulation is preferably in the form of an electrolytic capacitor and/or pressure sensor.

The electrical/electronic component 18 is surrounded by a protective shell 20 which protects the electrical/electronic component 18 from the thermal and mechanical strains which occur when the protective mass is cast or when protective mass is injection molded around the circuit module. A suitable material for the protective shell 20 is any kind of material which is capable of protecting the electrical/electronic component 18 from the thermal and mechanical loads when the protective mass 16 is cast or when protective mass 16 is injection molded around the circuit module 10. Preferably, the protective shell 20 is produced from a plastic, particularly from a thermoplastic, which is preferably elastically deformable. Preferably, the protective shell 20 and/or the protective mass 16 are produced using an injection molding method. The protective mass 16 is preferably produced by means of thermoset molding, where high mechanical and thermal loads occur. In the case of thermoset molding, the components are exposed to pressures of between approximately 2 and 40 bar and to temperatures of up to 180° C.

Figure 3:
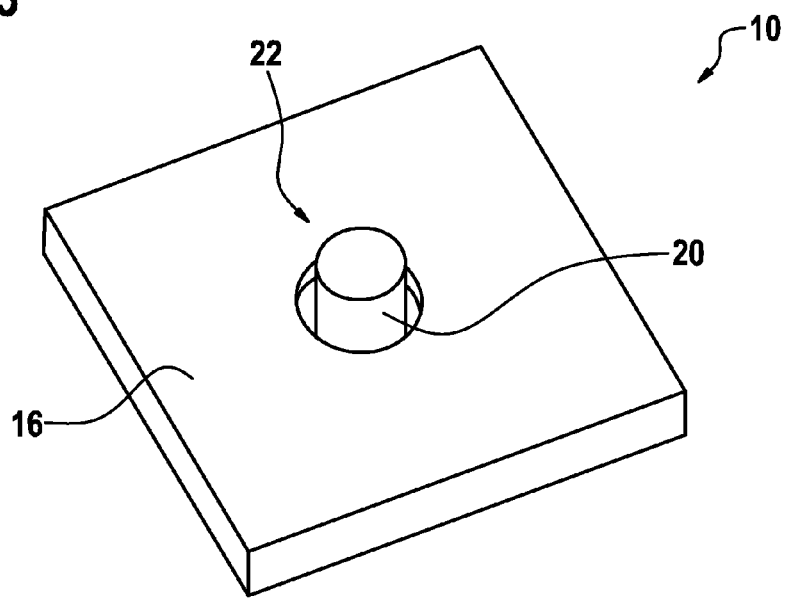
FIG. 3 shows a perspective illustration of the circuit module from FIG. 1.
Figure 4:
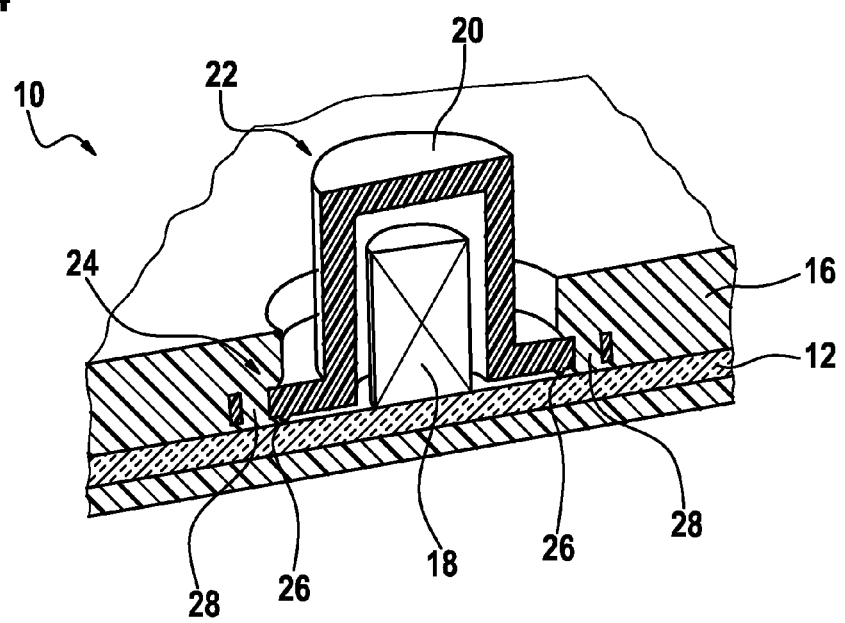
FIG. 4 shows a perspective sectional illustration of a sub region of the circuit module from FIG. 1 with the component surrounded by the protective shell.
Figure 5:
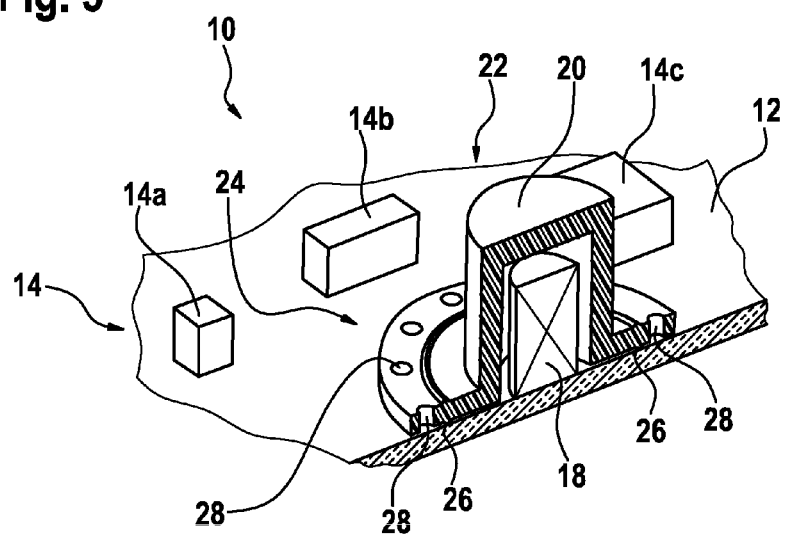
FIG. 5 shows a perspective sectional illustration of the sub region of the circuit module from FIG. 4 without a protective mass.

In order to provide component protection which protects the sensitive electrical/electronic component 18 from the injection molding or encapsulation or from the protective mass, so that the electrical/electronic component 18 can perform its function completely and without hindrance, the invention provides, as can be seen in FIGS. 1, 3 and 4, for the protective shell 20 of the discrete component 18 to be surrounded by the protective mass 16 only in part. In the present exemplary embodiment, the circuit carrier 12 is surrounded completely by the protective mass 16, with the exception of the area of the protective shell 20.

The protective shell 20 may be designed such that a plurality of components 18 can be held. That is to say that the shape of the protective shell 20 can be designed and produced in arbitrary fashion, so that it is also possible for a plurality of electrical/electronic components 18 to be protected.

Figure 6:
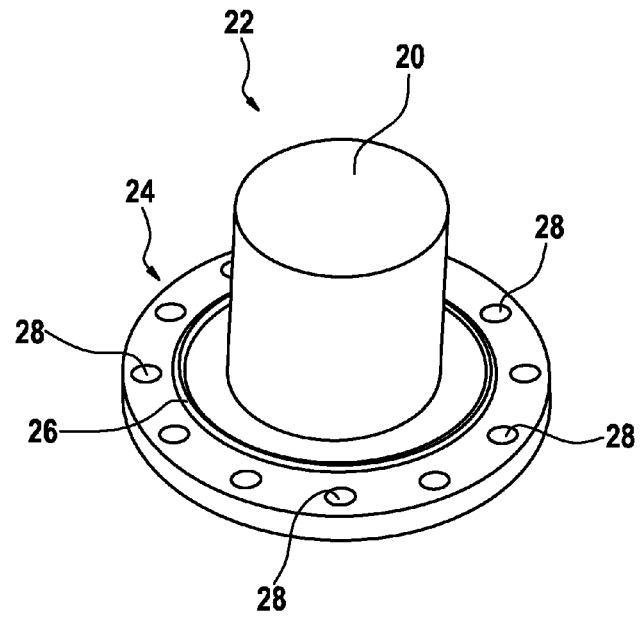
FIG. 6 shows a perspective illustration of a side view of the protective shell with a sealing device and structures.
Figure 7:
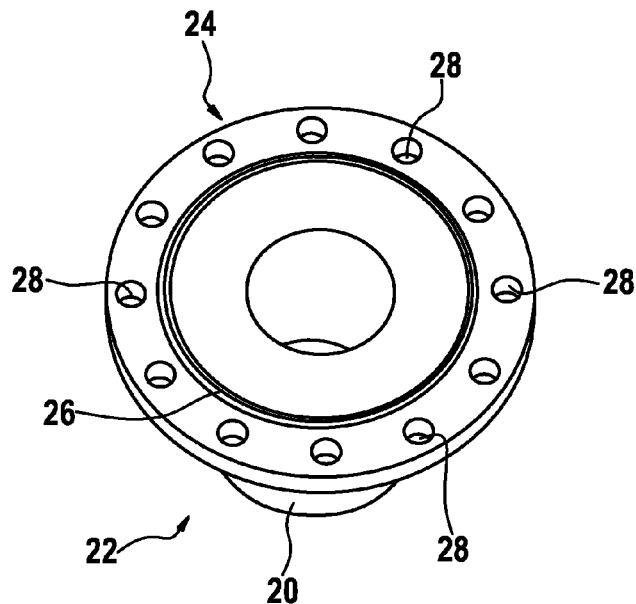
FIG. 7 shows a perspective illustration of the protective shell from FIG. 6 from below with the sealing device and the structures.

In the present exemplary embodiment, the protective shell 20 forms a holding area 22 for holding the at least one component 18 and a flange area 24 for tethering the protective shell 20 to the circuit carrier 12. As can be seen from FIGS. 6 to 8, in particular, the holding area 22 of the protective shell 20 is preferably in the form of a pot or beaker, the open end of which accommodates the flange area 24, which is in the form of a circumferential collar.

In order to seal the holding area 22 of the protective shell 20 from the protective mass 16 or from the circuit carrier 12, the flange area 24 of the protective shell 20 has at least one sealing device 26. In the present exemplary embodiment, this sealing device 26 is in the form of a circumferential rib in FIGS. 1 and 5 to 8.

In order to ensure better tethering of the protective shell 20 to the protective mass 16 and to the circuit carrier 12, the protective shell 20 has at least one structure 28, shown in FIGS. 4 to 8, in the flange area 24. In the present exemplary embodiment, a plurality of structures 28 in the form of perforations are provided.

Figure 8:
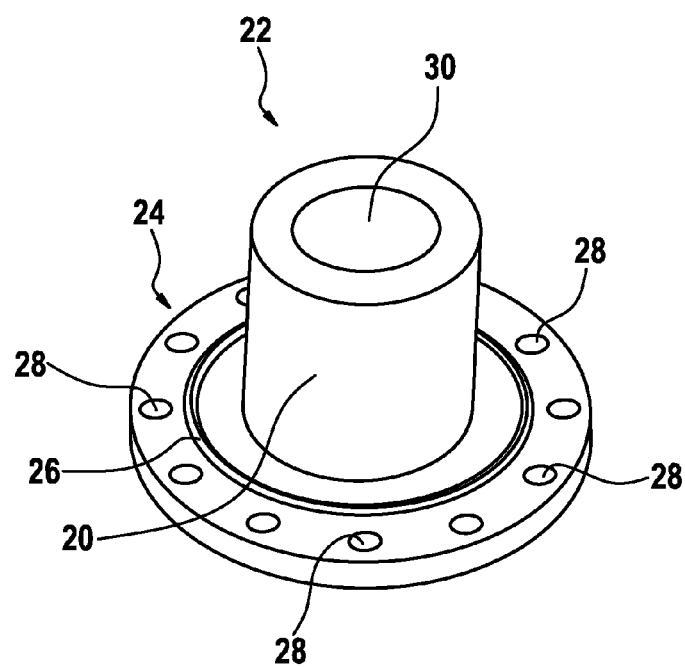
FIG. 8 shows a perspective illustration of a side view of the protective shell with a pressure equalization device.

So as to ensure that the ambient air pressure also prevails in the holding area 22 of the protective shell 20, the protective shell 20 shown in FIG. 8 preferably has a pressure equalization device 30. In the present exemplary embodiment, this pressure equalization device 30 is in the form of a diaphragm which is arranged at the bottom of the pot-like protective shell 20.

During the production of a circuit module 10 according to the invention, a circuit 14, which comprises one or more electrical/electronic components 14 to 14d suitable for injection molding or encapsulation, and at least one electrical/electronic component 18, which is not suitable for injection molding or encapsulation, are mounted on a circuit carrier 12. A protective shell 20 surrounding the electrical/electronic component 18 is put or placed onto the circuit carrier 12. The protective shell 20 is pressed onto the circuit carrier 12 using a suitable pressing tool or an injection molding or casting tool. During the injection molding or encapsulation, the protective shell 20 is pressed further onto the circuit carrier 12, as a result of which the sealing devices 26 in the form of ribs are elastically deformed or squashed and therefore perform a sealing function between the protective shell 20 and the circuit carrier 12. The protective mass 16 therefore cannot penetrate the holding area 22 of the protective shell 20. The injection molding or casting of the protective mass 16 also involves protective mass 16 being introduced into a structure 28 which is provided in the protective shell 20, so that better tethering of the protective shell 20 to the protective mass 16 and to the circuit carrier 12 is ensured. The protective mass 16 is injection molded or cast such that it surrounds the circuit 14 completely and the protective shell 20 of the electrical/electronic component 18 only in part.

The invention claimed is:

1. A circuit module having a circuit carrier (12), at least one circuit (14) which is mounted on the circuit carrier (12) and which is encapsulated by a protective mass (16), and at least one electrical/electronic component (18) which is surrounded by a protective shell (20) which protects at least the at least one electrical/electronic component (18) from the protective mass (16), wherein the protective shell (20) protecting the at least one electrical/electronic component (18) is surrounded by the protective mass (16) only in part, and wherein the protective shell (20) has a pressure equalization device (30) in the form of a diaphragm.

2. The circuit module as claimed in claim 1, characterized in that the protective shell (20) forms a holding area (22) for holding the at least one component (18) and a flange area (24) for tethering the protective shell (20) to the circuit carrier (12).

3. The circuit module as claimed in claim 1, characterized in that the holding area (52) of the protective shell (20) is in the form of a pot, the open end of which accommodates the flange area (24), which is in the form of a circumferential collar.

4. The circuit module as claimed in claim 1, characterized in that the flange area (24) has at least one sealing device (26).

5. The circuit module as claimed in claim 1, characterized in that the protective shell (20) is produced using an injection molding method.

6. The circuit module as claimed in claim 1, characterized in that the protective shell (20) is produced from a plastic.

7. A method for producing a circuit module (10) having a circuit carrier (12), at least one circuit (14) which is mounted on the circuit carrier (12) and which is surrounded by a protective mass (16), and at least one electrical/electronic component (18) which is surrounded by a protective shell (20) which protects at least the component (18) from the protective mass (16), the method comprising:
mounting the at least one circuit (14) and the at least one electrical/electronic component (18) on the circuit carrier (12);
putting the protective shell (20) which surrounds the at least one electrical/electronic component (18) and has a pressure equalization device (30) in the form of a diaphragm onto the circuit carrier (12);
pressing the protective shell (20) onto the circuit carrier (12) using a tool; and
encapsulating the circuit (14) completely and the protective shell (20) of the electrical/electronic component (18) in part with the protective mass.

8. The method as claimed in claim 7, further including elastically deforming at least one sealing device (26) fitted to the protective shell (20) to form a seal.

9. The method as claimed in claim 7, characterized in that encapsulating with the protective mass (16) involves the protective mass (16) being introduced into at least one structure (28) which is provided in the protective shell (20).

10. The circuit module as claimed in claim 1, characterized in that the flange area (24) has at least one structure (28).

11. The circuit module as claimed in claim 10, characterized in that the flange area (24) has at least one sealing device (26).

12. The circuit module as claimed in claim 1, characterized in that the protective shell (20) is produced from a thermoplastic.

13. The circuit module as claimed in claim 1, wherein the protective mass is a cast material.

14. The circuit module as claimed in claim 1, wherein the protective mass is an injection molded material.

15. The method of claim 7, wherein encapsulating the circuit (14) completely and the protective shell (20) of the electrical/electronic component (18) in part with the protective mass means encapsulating by casting.

16. The method of claim 7, wherein encapsulating the circuit (14) completely and the protective shell (20) of the electrical/electronic component (18) in part with the protective mass means encapsulating by injection molding.

17. The method as claimed in claim 7, wherein encapsulating the circuit (14) completely and the protective shell (20) of the electrical/electronic component (18) in part with the protective mass means encapsulating by thermoset molding.

* * * * *